(12) United States Patent
Hirata et al.

(10) Patent No.: US 11,270,810 B2
(45) Date of Patent: Mar. 8, 2022

(54) ELECTRICALLY CONDUCTIVE PASTE

(71) Applicant: DOWA ELECTRONICS MATERIALS CO., LTD., Tokyo (JP)

(72) Inventors: Aiko Hirata, Tokyo (JP); Noriaki Nogami, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/626,667

(22) PCT Filed: Jun. 27, 2018

(86) PCT No.: PCT/JP2018/024270
§ 371 (c)(1),
(2) Date: Dec. 26, 2019

(87) PCT Pub. No.: WO2019/009146
PCT Pub. Date: Jan. 10, 2019

(65) Prior Publication Data
US 2020/0118703 A1 Apr. 16, 2020

(30) Foreign Application Priority Data

Jul. 3, 2017 (JP) .............................. JP2017-130031
Jun. 25, 2018 (JP) .............................. JP2018-119745

(51) Int. Cl.
*H01B 1/22* (2006.01)
*B22F 1/02* (2006.01)
*H01B 1/02* (2006.01)

(52) U.S. Cl.
CPC .............. *H01B 1/22* (2013.01); *B22F 1/025* (2013.01); *H01B 1/026* (2013.01)

(58) Field of Classification Search
CPC ...... B22F 1/025; B22F 1/0059; B22F 1/0062; C22C 1/0425; C22C 1/0466; C22C 5/06; C22C 9/00; C09D 11/033; C09D 11/037; C09D 11/102; C09D 11/52; H01L 31/22; H01L 31/026
USPC ...................... 252/500, 506, 510, 514, 520.3
See application file for complete search history.

(56) References Cited

U.S. PATENT DOCUMENTS

| 2009/0220738 A1* | 9/2009 | Oka | ........................ H01B 1/22 428/137 |
| 2018/0163069 A1* | 6/2018 | Wakita | ..................... C09D 7/69 |

FOREIGN PATENT DOCUMENTS

| JP | H05230400 A | * | 2/1993 | ............... C09D 5/24 |
| JP | 0790239 A | | 4/1995 | |
| JP | 1192739 A | | 4/1999 | |
| JP | 2004355933 A | * | 12/2004 | ............... H05K 1/09 |
| JP | 2010077495 A | | 4/2010 | |
| JP | 2011086397 A | * | 4/2011 | ............... B22F 1/00 |
| JP | 2011140714 A | * | 7/2011 | ............... B22F 1/00 |
| JP | 2011140714 A | | 7/2011 | |
| JP | 2012253031 A | | 12/2012 | |
| JP | 5297344 B2 | * | 9/2013 | ............... B22F 1/00 |
| JP | 2016119255 A | | 6/2016 | |
| WO | 2006129487 A1 | | 12/2006 | |

OTHER PUBLICATIONS

International search report for patent application No. PCT/JP2018/024270 dated Aug. 28, 2018.

* cited by examiner

*Primary Examiner* — Tri V Nguyen
(74) *Attorney, Agent, or Firm* — Bachman and Lapointe PC; George Coury

(57) ABSTRACT

There is provided an electrically conductive paste which can prevent the increase of the volume resistivity of an electrically conductive film formed from the electrically conductive paste even if the electrically conductive film is heated to a soldering temperature of about 380° C. when the electrically conductive paste is a resin type electrically conductive paste using a silver powder and a silver-coated copper powder. In an electrically conductive paste containing a resin, a silver powder and a silver-coated copper powder having a copper powder, the surface of which is coated with a silver layer, the resin is an epoxy resin having a naphthalene skeleton, and there is added a dicarboxylic acid, preferably a dicarboxylic acid having a rational formula of HOOC—$(CH_2)_n$—COOH (n=1-8), and more preferably a dicarboxylic acid having a rational formula of HOOC—$(CH_2)_n$—COOH (n=4-7).

12 Claims, No Drawings

US 11,270,810 B2

ELECTRICALLY CONDUCTIVE PASTE

TECHNICAL FIELD

The present invention relates generally to an electrically conductive paste. More specifically, the invention relates to an electrically conductive paste which uses a silver-coated copper powder and a silver powder as electrically conductive metal powders.

BACKGROUND ART

An electrically conductive paste prepared by mixing or compounding a solvent, a resin, a dispersant and so forth with an electrically conductive metal powder, such as silver or copper powder, is conventionally used for forming electrodes and electric wires of electronic parts by a printing method or the like.

However, silver powder increases the costs of the paste since it is a noble metal powder although it is a good electrically conductive material having a very low volume resistivity. On the other hand, the storage stability (reliability) of copper powder is inferior to that of silver powder since copper powder is easily oxidized although it is a good electrically conductive material having a low volume resistivity.

In order to solve these problems, as metal powders for use in electrically conductive pastes, there is proposed a silver-coated copper powder wherein the surface of copper powder is coated with silver (see, e.g., Patent Documents 1-2). It is also proposed that a silver powder and a silver-coated copper powder are used as metal powders for an electrically conductive paste (see, e.g., Patent Document 3).

In recent years, as an electrically conductive paste used for forming an electrically conductive film such as a busbar electrode of a solar cell or the like, it is attempted to use an electrically conductive paste using a silver-coated copper powder, which is cheaper than silver powder, in place of an electrically conductive paste using silver powder, and it is studied to use an electrically conductive paste using a silver powder and a silver-coated copper powder.

In typical silicon solar cells, a baked type electrically conductive paste using a silver powder is burned at a high temperature of about 800° C. in the atmosphere to form an electrode. However, an electrically conductive paste using a copper powder or a silver-coated copper powder is used, the copper powder or the silver-coated copper powder are oxidized when it is burned at such a high temperature in the atmosphere. For that reason, it is required to use special techniques such as burning in an inert atmosphere, so that the costs thereof are enhanced.

On the other hand, in an HIT (Heterojunction with Intrinsic Thin-layer) solar cells (monocrystalline hybrid type solar cells), a curable resin type electrically conductive paste using a silver powder is usually heated at a temperature of about 200° C. in the atmosphere to be cured to form an electrode. Since copper powders and silver-coated copper powders are resistant to oxidation even if they are heated at such a low temperature in the atmosphere, it is possible to use a curable resin type electrically conductive paste using a silver-coated copper powder, and a curable resin type electrically conductive paste using a silver powder and a silver-coated copper powder.

PRIOR ART DOCUMENT(S)

Patent Document(s)

Patent Document 1: Japanese Patent Laid-Open No. 2010-174311 (Paragraph Number 0003)

Patent Document 2: Japanese Patent Laid-Open No. 2010-077495 (Paragraph Number 0006)

Patent Document 3: Japanese Patent Laid-Open No. 11-92739 (Paragraph Number 0008)

SUMMARY OF THE INVENTION

Problem to be Solved by the Invention

However, the inventors have found that, if a busbar electrode, which is formed from a conventional resin type electrically conductive paste obtained by kneading the above-described silver powder and silver-coated copper powder with a resin such as a bisphenol A epoxy resin, is connected to a tab wire by soldering, there is some possibility that the resin of the electrically conductive paste may be decomposed at a soldering temperature (about 380° C.), so that the resistance of the busbar electrode is increased to lower the conversion efficiency of the solar cell.

It is therefore an object of the present invention to eliminate the aforementioned conventional problems and to provide an electrically conductive paste which can prevent the increase of the volume resistivity of an electrically conductive film formed from the electrically conductive paste even if the electrically conductive film is heated to a soldering temperature of about 380° C. when the electrically conductive paste is a resin type electrically conductive paste using a silver powder and a silver-coated copper powder.

Means for Solving the Problem

In order to accomplish the aforementioned object, the inventors have diligently studied and found that it is possible to prevent the increase of the volume resistivity of an electrically conductive film even if it is heated at a soldering temperature of about 380° C., if the electrically conductive film is prepared from an electrically conductive paste comprising: a silver-coated copper powder having a copper powder, the surface of which is coated with a silver layer; a silver powder; and an epoxy resin having a naphthalene skeleton. Thus, the inventors have made the present invention.

According to the present invention, there is provided an electrically conductive paste comprising: a silver-coated copper powder having a copper powder, the surface of which is coated with a silver layer; a silver powder; and an epoxy resin having a naphthalene skeleton.

This electrically conductive paste preferably contains a dicarboxylic acid. The dicarboxylic acid is preferably adhered to the silver powder. The dicarboxylic acid is preferably a dicarboxylic acid having a rational formula of $HOOC-(CH_2)_n-COOH$ (n=1-8), and the n in the rational formula is more preferably 4 to 7. The amount of the dicarboxylic acid in the electrically conductive paste is preferably 0.01 to 0.25% by weight with respect to silver in the silver layer and silver powder, and is preferably 0.1% by weight or less with respect to the electrically conductive paste.

The electrically conductive paste preferably contains a solvent, and preferably contains a curing agent. The silver-coated copper powder preferably has an average particle diameter of 1 to 20 μm, and the silver powder preferably has an average particle diameter of 0.1 to 3 μm. The amount of the silver-coated copper powder in the electrically conductive paste is preferably 40 to 94% by weight, and the amount of the silver powder therein is preferably 4 to 58% by weight, the total amount of the silver-coated copper powder and the silver powder therein being preferably 75 to 98% by weight. The amount of the silver layer with respect to the silver-coated copper powder is preferably 5% by weight or more.

Throughout the specification, the expression "average particle diameter" means a volume-based particle diameter ($D_{50}$ diameter) corresponding to 50% of accumulation in cumulative distribution, which is measured by means of a laser diffraction particle size analyzer.

Effects of the Invention

According to the present invention, it is possible to provide an electrically conductive paste which can prevent the increase of the volume resistivity of an electrically conductive film formed from the electrically conductive paste even if the electrically conductive film is heated to a soldering temperature of about 380° C. when the electrically conductive paste is a resin type electrically conductive paste using a silver powder and a silver-coated copper powder.

MODE FOR CARRYING OUT THE INVENTION

The preferred embodiment of an electrically conductive paste according to the present invention, contains: a silver-coated copper powder having a copper powder, the surface of which is coated with a silver layer; a silver powder; and an epoxy resin having a naphthalene skeleton.

As a resin having a naphthalene skeleton contained in the electrically conductive paste, there may be used an epoxy resin having a naphthalene skeleton as shown in Chemical Formula 1 (e.g., HP4710 produced by DIC Corporation). The content of the epoxy resin having the naphthalene skeleton is preferably 1 to 20% by weight (more preferably 3 to 10% by weight) with respect to the electrically conductive paste. If the content of the epoxy resin having the naphthalene is too small, the function of protecting the surface of the silver-coated copper powder from oxidation due to heating is insufficient. On the other hand, if the content of the epoxy resin having the naphthalene is too large, there are deteriorated the printability of the electrically conductive paste when it is printed in the form of a busbar electrode of a solar cell, and the bonding strength of solder when the busbar electrode is soldered to a tab wire, and there is increased the resistance of the busbar electrode of the solar cell produced from the electrically conductive paste. Furthermore, it is possible to identify whether the resin is an epoxy resin having a naphthalene skeleton by means of a gas chromatography mass spectrometer (GC-MC) or C13-NMR.

[Chemical Formula 1]

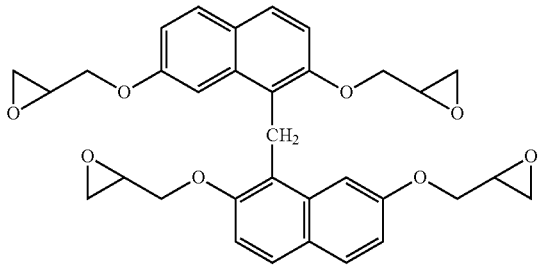

The above-described electrically conductive paste preferably contains a dicarboxylic acid, such as adipic acid, azelaic acid or phthalic acid. This dicarboxylic acid is preferably adhered to the silver powder. The dicarboxylic acid is preferably a dicarboxylic acid having a rational formula of $HOOC-(CH_2)_n-COOH$ (n=1-8), and the n in the rational formula is more preferably 4 to 7 as adipic acid or azelaic acid. The amount of the dicarboxylic acid in the electrically conductive paste is preferably 0.25% by weight or less (more preferably 0.01 to 0.25% by weight) with respect to silver in the silver layer and silver powder, and is preferably 0.1% by weight or less with respect to the electrically conductive paste. Furthermore, the qualitative and quantitative analyses of the dicarboxylic acid in the electrically conductive paste can be carried out, for example, by means of a gas chromatography mass spectrometer (GC-MS) after the steps of eluting the dicarboxylic acid with hydrochloric acid, adding methanol (or esterizing agent) to the hydrochloric acid solution containing the eluted dicarboxylic acid to methylate (or esterize) the dicarboxylic acid, and extracting the methylated (or esterized) dicarboxylic acid with an organic solvent.

The electrically conductive paste preferably contains a solvent. This solvent can be suitably selected in accordance with the intended purpose of the electrically conductive paste. For example, the solvent can be used by selecting one or more among solvents which include butyl carbitol acetate (BCA), butyl carbitol (BC), ethyl carbitol acetate (ECA), ethyl carbitol (EC), toluene, methyl ethyl ketone, methyl isobutyl ketone, tetradecane, tetralin, propyl alcohol, isopropyl alcohol, dihydroterpineol, dihydroterpineol acetate, ethyl carbitol, 2,2,4-trimethyl-1,3-pentanediol monoisobutyrate (texanol) and so forth. The content of the solvent is preferably 0 to 20% by weight (more preferably to 10% by weight) with respect to the electrically conductive paste.

The electrically conductive paste preferably contains a curing agent. As the curing agent, there is preferably used a curing agent of at least one of imidazole and boron trifluoride amine. The content of the curing agent is preferably 0.1 to 10% by weight (more preferably 0.2 to 6% by weight) with respect to the epoxy resin.

The electrically conductive paste may contain other components, such as surfactant(s), dispersant(s), rheology control agent(s), silane coupling agent(s) and ion collecting agent(s).

In the electrically conductive paste, the silver-coated copper powder having a copper powder, the surface of which is coated with the silver layer, and the silver powder are used as conductors. The shape of the copper powder coated with the silver layer (the shape of the silver-coated copper powder) may be substantially spherical or flake-shaped. The average particle diameter of the silver-coated copper powder is preferably 1 to 20 μm, and the average particle diameter of the silver powder is preferably 0.1 to μm. The amount of the silver-coated copper powder in the electrically conductive paste is preferably 40 to 94% by weight, and the amount of the silver powder therein is preferably 4 to 58% by weight, the total amount of the silver-coated copper powder and the silver powder therein being preferably 75 to 98% by weight.

The silver layer of the silver-coated copper powder is preferably a layer of silver or a silver compound, and more preferably a layer of 90% by weight or more of silver. The amount of silver with respect to the silver-coated copper powder is preferably not less than 5% by weight, more preferably in the range of from 7% by weight to 50% by weight, more preferably in the range of from 8% by weight to 40% by weight, and most preferably in the range of from 9% by weight to 20% by weight. If the amount of silver is less than 5% by weight, it is not preferable since there is a bad influence on the electrical conductivity of the silver-coated copper powder. On the other hand, if the amount of silver exceeds 50% by weight, it is not preferable since the costs are enhanced by the increase of the amount of silver to be used.

Although the copper powder used for producing the silver-coated copper powder may be produced by a wet reducing method, an electrolytic method, a gas phase method or the like, it is preferably produced by a so-called atomizing method (such as a gas atomizing method or a water atomizing method) for producing a fine powder by rapidly cooling and solidifying copper, which is melted at a temperature of not lower than the melting temperature thereof, by causing a high-pressure gas or high-pressure water to collide with the molten copper while causing the molten copper to drop from the lower portion of a tundish. In particular, if the copper powder is produced by a so-called water atomizing method for spraying a high-pressure water, it is possible to obtain a copper powder having small particle diameters, so that it is possible to improve the electrical conductivity of an electrically conductive paste due to the increase of the number of contact points between the particles when the copper powder is used for preparing the electrically conductive paste.

As a method for coating the copper powder with silver, there may be used a method for depositing silver or a silver compound on the surface of a copper powder by a substitution method utilizing a substitution reaction of copper with silver or by a reduction method using a reducing agent. For example, there may be used a method for depositing silver or a silver compound on the surface of a copper powder while stirring a solution containing the copper powder and silver or the silver compound in a solvent, and a method for depositing silver or a silver compound on the surface of a copper powder while stirring a mixed solution prepared by mixing a solution, which contains the copper powder and organic substances in a solvent, with a solution containing silver or the silver compound and organic substances in a solvent, and so forth.

As the solvent, there may be used water, an organic solvent or a mixed solvent thereof. If a solvent prepared by mixing water with an organic solvent is used, it is required to use an organic solvent which is liquid at room temperature (20 to 30° C.), and the mixing ratio of water to the organic solvent may be suitably adjusted in accordance with the used organic solvent. As water used as the solvent, there may be used distilled water, ion-exchanged water, industrial water or the like unless there is the possibility that impurities are mixed therein.

As raw materials of the silver layer, silver nitrate having a high solubility with respect to water and many organic solvents is preferably used since it is required to cause silver ions to exist in the solution. In order to carry out a reaction for coating the copper powder with the silver layer (silver coating reaction) as uniform as possible, there is preferably used a silver nitrate solution, which is prepared by dissolving silver nitrate in a solvent (water, an organic solvent or a mixed solvent thereof), not solid silver nitrate. The amount of the silver nitrate solution to be used, the concentration of silver nitrate in the silver nitrate solution, and the amount of the organic solvent may be determined in accordance with the amount of the intended silver layer.

In order to more uniformly form the silver layer, a chelating agent may be added to the solution. As the chelating agent, there is preferably used a chelating agent having a high complex formation constant with respect to copper ions or the like, so as to prevent the reprecipitation of copper ions or the like, which are formed as vice-generative products by a substitution reaction of silver ions with metallic copper. In particular, the chelating agent is preferably selected in view of the complex formation constant with respect to copper since the copper powder serving as the core of the silver-coated copper powder contains copper as a main component. Specifically, as the chelating agent, there may be used a chelating agent selected from the group consisting of ethylene-diamine-tetraacetic acid (EDTA), iminodiacetic acid, diethylene-triamine, triethylene-diamine, and salts thereof.

In order to stably and safely carry out the silver coating reaction, a buffer for pH may be added to the solution. As the buffer for pH, there may be used ammonium carbonate, ammonium hydrogen carbonate, ammonia water, sodium hydrogen carbonate or the like.

When the silver coating reaction is carried out, a solution containing a silver salt is preferably added to a solution in which the copper powder is sufficiently dispersed by stirring the solution after the copper powder is put therein before the silver salt is added thereto. The reaction temperature during this silver coating reaction may be a temperature at which the solidification and evaporation of the reaction solution are not caused. The reaction temperature is set to be preferably 10 to 40° C. and more preferably 15 to 35° C. The reaction time may be set in the range of from 1 minute to 5 hours although it varies in accordance with the amount of silver or the silver compound and the reaction temperature.

EXAMPLES

Examples of an electrically conductive paste according to the present invention will be described below in detail.

Example 1

There was prepared a commercially available copper powder produced by atomizing (atomized copper powder SF-Cu 5 μm produced by Nippon Atomized Metal Powders Corporation). The particle size distribution of this copper powder (before being coated with silver) was derived. As a result, the particle diameter ($D_{10}$) corresponding to 10% of accumulation in cumulative distribution of the copper powder was 2.26 μm, the particle diameter ($D_{50}$) corresponding to 50% of accumulation in cumulative distribution of the copper powder was 5.20 μm, and the particle diameter ($D_{90}$) corresponding to 90% of accumulation in cumulative distribution of the copper powder was 9.32 μm. Furthermore, the particle size distribution of the copper powder was measured by means of a laser diffraction particle size analyzer (Micro-Track Particle Size Distribution Measuring Apparatus MT-3300 produced by Nikkiso Co., Ltd.) for deriving the particle diameters $D_{10}$, $D_{50}$ and $D_{90}$ of the copper powder.

Then, a solution (solution 1) was prepared by dissolving 2.6 kg of ammonium carbonate in 450 kg of pure water, and a solution (solution 2) was prepared by adding 92 kg of an aqueous silver nitrate solution containing 16.904 kg of silver to a solution prepared by dissolving 319 kg of EDTA-4Na (43%) and 76 kg of ammonium carbonate in 284 kg of pure water.

Then, under a nitrogen atmosphere, 100 kg of the above-described copper powder was added to the solution 1, and the temperature thereof was raised to 35° C. while being stirred. Then, the solution 2 was added to the solution in which the copper powder was dispersed, and it was stirred for 30 minutes. Thereafter, it was filtered, washed with water, and dried to obtain a copper powder coated with silver (a silver-coated copper powder). Furthermore, washing with water was carried out by pouring pure water to a solid body, which was obtained by filtering, until the electrical potential of the liquid after washing was decreased to be 0.5 mS/m or less.

After 5.0 g of the silver-coated copper powder thus obtained was dissolved in 40 mL of an aqueous silver nitrate solution which was prepared by diluting an aqueous silver nitrate solution having a specific gravity of 1.38 with pure water so as to have a volume ratio of 1:1, and the solution thus prepared was boiled by a heater to completely dissolve the silver-coated copper powder therein. Then, this solution was added, little by little, to an aqueous hydrochloric acid solution, which was prepared by diluting an aqueous hydrochloric acid solution having a specific gravity of 1.18 with pure water so as to have a volume ratio of 1:1, to cause silver chloride to be deposited. Until any precipitate was not caused, the addition of the aqueous hydrochloric acid solution was continued to obtain silver chloride. Then, the content of Ag was derived from the obtained silver chloride by gravimetric method. As a result, the content of Ag in the silver-coated copper powder was 10.14% by weight. Then, 0.1 g of the silver-coated copper powder was added to 40 mL of isopropyl alcohol to be dispersed for 2 minutes by means of an ultrasonic homogenizer (having a chip with a tip diameter of 20 mm), to measure the particle size distribution of the silver-coated copper powder by means of a laser diffraction scattering particle size analyzer (MICROTRAC MT3300 EXII produced by Microtrac BEL Corporation). As a result, the particle diameter ($D_{10}$) corresponding to 10% of accumulation in volume-based cumulative distribution was 2.5 µm, the particle diameter ($D_{50}$) corresponding to 50% of accumulation in volume-based cumulative distribution was 5.2 µm, and the particle diameter ($D_{90}$) corresponding to 90% of accumulation in volume-based cumulative distribution was 10.1 µm.

Then, the BET specific surface area of the silver-coated copper powder was measured by means of a BET specific surface area measuring apparatus (4-Sorb US produced by Yuasa Ionics Co., Ltd.) using the single point BET method. As a result, the BET specific surface area of the silver-coated copper powder was 0.31 $m^2/g$.

After 79.0 parts by weight of the obtained silver-coated copper powder, 8.8 parts by weight of a silver powder (Ag-2-1C produced by DOWA ELECTRONICS MATERIALS CO., LTD.) having an average primary particle diameter of 1 µm, 6.5 parts by weight of an epoxy resin having a naphthalene skeleton shown by Chemical Formula 1 (HP4710 produced by DIC Corporation), 5.3 parts by weight of butyl carbitol acetate (produced by Wako Pure Chemical Industries, Ltd.) serving as a solvent, 0.3 parts by weight of imidazole (2E4MZ produced by Shikoku Chemicals Corporation) serving as a curing agent, 0.1 parts by weight of oleic acid (produced by Wako Pure Chemical Industries, Ltd.) serving as a dispersant were mixed (preliminarily kneaded) by means of a planetary centrifugal vacuum degassing mixer (Awatori Rentaro produced by Thinky Corporation), the obtained mixture was kneaded by means of a three-roll mill (EXAKT 80S produced by Otto Hermann Inc.) to obtain an electrically conductive paste (containing 87.8% by weight of the total of the silver-coated copper powder and silver powder).

The conductive paste thus obtained was printed on an alumina substrate at a squeegee pressure of 0.18 MPa by means of a screen printing machine (MT-320T produced by Micro-tec Co., Ltd.) so as to form a linear film having a width of 500 µm×a length of 37.5 mm. The linear film thus formed was heated at 150° C. for 10 minutes by means of an atmospheric circulation type drier, and then, heated at 200° C. for 30 minutes to be dried and cured to form an electrically conductive film. With respect to the electrically conductive film thus formed, the line width thereof was measured by means of a microscope (Digital Microscope VHK-5000 produced by Keyence Corporation), the average thickness thereof was measured by means of a surface roughness tester (SE-30D produced by Kosaka Laboratory Ltd.), and the resistance thereof was measured by causing the terminals of a digital multimeter (Digital Multimeter R6551 produced by Advantest Corporation) to contact both ends of the linear electrically conductive film, so that the volume resistivity (initial volume resistivity) thereof was calculated. As a result, the initial volume resistivity was 85 µΩ·cm. Then, while a soldering iron having a temperature of 380° C. was caused to contact the electrically conductive film so that the same level heating as that of soldering was applied to the electrically conductive film, the soldering iron was moved at a speed of 10 mm/sec. After the electrically conductive film was thus heated, the resistance of the electrically conductive film was measured to calculate the volume resistivity (volume resistivity after heating) thereof. As a result, the volume resistivity after heating was 91 µΩ·cm, so that the rate of variability in volume resistivity after heating to the initial volume resistivity was 107%.

Example 2

After 50 g of the same silver powder as that in Example 1 was put in an electrically-powered coffee mill (Select Grind MJ-518 produced by Melitta Japan Limited) to be pulverized for 10 seconds, 0.35 g of an ethanol solution containing 10% by weight of adipic acid, which was obtained by dissolving adipic acid in ethanol, was added to the pulverized silver powder to further pulverize the pulverized silver powder for 20 minutes to prepare a silver powder to which adipic acid was adhered. Then, an electrically conductive paste (containing 87.8% by weight of the total of the silver-coated copper powder and silver powder) was prepared by the same method as that in Example 1, except that the adipic acid-adhered silver powder was used for causiong 0.006% by weight of adipic acid (0.07% by weight of adipic acid with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 79 µΩ·cm, and the volume resistivity after heating was 86 µΩ·cm, so that the rate of variability in volume resistivity was 108%.

Example 3

An electrically conductive paste (containing 87.8% by weight of the total of the silver-coated copper powder and silver powder) was prepared by the same method as that in Example 1, except that 0.006% by weight of adipic acid (0.07% by weight of adipic acid with respect to silver) was added before the mixing (preliminarily kneading).

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 81 µΩ·cm, and the volume resistivity after heating was 87 µΩ·cm, so that the rate of variability in volume resistivity was 108%.

Example 4

A silver powder, to which azelaic acid was adhered, was prepared by the same method as that in Example 2, except that there was added 0.35 g of an ethanol solution containing 10% by weight of azelaic acid obtained by using azelaic acid in place of adipic acid. Then, an electrically conductive paste (containing 87.8% by weight of the total of the silver-coated copper powder and silver powder) was prepared by the same method as that in Example 1, except that the azelaic acid-adhered silver powder was used for causing 0.006% by weight of azelaic acid (0.07% by weight of azelaic acid with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 71 µΩ·cm, and the volume resistivity after heating was 79 µΩ·cm, so that the rate of variability in volume resistivity was 110%.

Example 5

A silver powder, to which phthalic acid was adhered, was prepared by the same method as that in Example 2, except that there was added 0.35 g of an ethanol solution containing 10% by weight of phthalic acid obtained by using phthalic acid in place of adipic acid. Then, an electrically conductive paste (containing 87.8% by weight of the total of the silver-coated copper powder and silver powder) was prepared by the same method as that in Example 1, except that the phthalic acid-adhered silver powder was used for causing 0.006% by weight of phthalic acid (0.07% by weight of phthalic acid with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 95 µΩ·cm, and the volume resistivity after heating was 98 µΩ·cm, so that the rate of variability in volume resistivity was 103%.

Example 6

A silver powder, to which phthalic anhydride was adhered, was prepared by the same method as that in Example 2, except that there was added 0.35 g of an ethanol solution containing 10% by weight of phthalic anhydride obtained by using phthalic anhydride in place of adipic acid. Then, an electrically conductive paste (containing 87.8% by weight of the total of the silver-coated copper powder and silver powder) was prepared by the same method as that in Example 1, except that the phthalic anhydride-adhered silver powder was used for causing 0.006% by weight of phthalic anhydride (0.07% by weight of phthalic anhydride with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 87 µΩ·cm, and the volume resistivity after heating was 92 µΩ·cm, so that the rate of variability in volume resistivity was 106%.

Example 7

An electrically conductive paste (containing 87.8% by weight of the total of the silver-coated copper powder and silver powder) was prepared by the same method as that in Example 1, except that the amounts of the silver-coated copper powder and silver powder were 43.9 parts by weight, respectively.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 56 µΩ·cm, and the volume resistivity after heating was 55 µΩ·cm, so that the rate of variability in volume resistivity was 99%.

Example 8

A silver powder, to which adipic acid was adhered, was prepared by the same method as that in Example 2, except that the amount of the ethanol solution containing adipic acid was 0.21 g. Then, an electrically conductive paste (containing 87.8% by weight of the total of the silver-coated copper powder and silver powder) was prepared by the same method as that in Example 7, except that the adipic acid-adhered silver powder was used for causing 0.018% by weight of adipic acid (0.04% by weight of adipic acid with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 36 µΩ·cm, and the volume resistivity after heating was 36 µΩ·cm, so that the rate of variability in volume resistivity was 100%.

Example 9

A silver powder, to which adipic acid was adhered, was prepared by the same method as that in Example 2, except that the amount of the ethanol solution containing adipic acid was 0.35 g. Then, an electrically conductive paste (containing 87.8% by weight of the total of the silver-coated copper powder and silver powder) was prepared by the same method as that in Example 7, except that the adipic acid-adhered silver powder was used for causing 0.031% by weight of adipic acid (0.07% by weight of adipic acid with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 37 µΩ·cm, and the volume resistivity after heating was 38 µΩ·cm, so that the rate of variability in volume resistivity was 103%.

Example 10

A silver powder, to which adipic acid was adhered, was prepared by the same method as that in Example 2, except The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 43 µΩ·cm, and the volume resistivity after heating was 45 µΩ·cm, so that the rate of variability in volume resistivity was 103%.

Comparative Example 1

An electrically conductive paste (containing 88.8% by weight of the total of the silver-coated copper powder and silver powder) was prepared by the same method as that in Example 1, except that a bisphenol F epoxy resin shown by Chemical Formula (EP4901E produced by ADEKA Corporation) was used in place of the epoxy resin having the naphthalene skeleton in the electrically conductive paste and that the amount of the silver-coated copper powder was 79.9 parts by weight and the amount of the silver powder was 8.9 parts by weight.

[Chemical Formula 2]

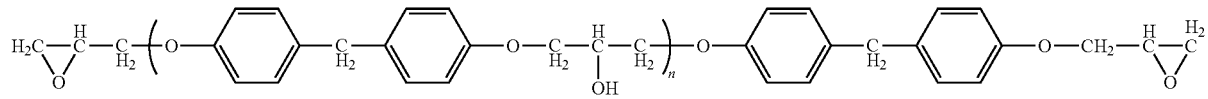

that the amount of the ethanol solution containing adipic acid was 0.49 g. Then, an electrically conductive paste (containing 87.8% by weight of the total of the silver-coated copper powder and silver powder) was prepared by the same method as that in Example 7, except that the adipic acid-adhered silver powder was used for causing 0.043% by weight of adipic acid (0.10% by weight of adipic acid with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 41 µΩ·cm, and the volume resistivity after heating was 42 µΩ·cm, so that the rate of variability in volume resistivity was 103%.

Example 11

A silver powder, to which adipic acid was adhered, was prepared by the same method as that in Example 2, except that the amount of the ethanol solution containing adipic acid was 0.63 g. Then, an electrically conductive paste (containing 87.8% by weight of the total of the silver-coated copper powder and silver powder) was prepared by the same method as that in Example 7, except that the adipic acid-adhered silver powder was used for causing 0.055% by weight of adipic acid (0.13% by weight of adipic acid with respect to silver) to be contained in the electrically conductive paste.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 68 µΩ·cm, and the volume resistivity after heating was 142 µΩ·cm, so that the rate of variability in volume resistivity was 210%.

Comparative Example 2

An electrically conductive paste (containing 88.8% by weight of the total of the silver-coated copper powder and silver powder) was prepared by the same method as that in Example 2, except that a bisphenol F epoxy resin shown by Chemical Formula (EP4901E produced by ADEKA Corporation) was used in place of the epoxy resin having the naphthalene skeleton and that the amount of the silver-coated copper powder was 79.9 parts by weight and the amount of the silver powder was 8.9 parts by weight.

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 49 µΩ·cm, and the volume resistivity after heating was 103 µΩ·cm, so that the rate of variability in volume resistivity was 211%.

Comparative Example 3

An electrically conductive paste (containing 87.8% by weight of the total of the silver-coated copper powder and silver powder) was prepared by the same method as that in Example 1, except that a bisphenol A epoxy resin shown by Chemical Formula (JER828E produced by Mitsubishi Chemical Corporation) was used in place of the epoxy resin having the naphthalene skeleton.

[Chemical Formula 3]

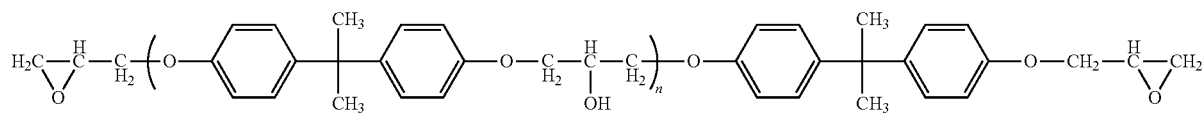

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 235 μΩ·cm, and the volume resistivity after heating was 510 μΩ·cm, so that the rate of variability in volume resistivity was 217%.

Comparative Example 4

An electrically conductive paste (containing 87.8% by weight of the total of the silver-coated copper powder and silver powder) was prepared by the same method as that in Example 1, except that an epoxy resin having a biphenyl skeleton shown by Chemical Formula 4 (NC-3000-H produced by Nippon Kayaku Co., Ltd.) was used in place of the epoxy resin having the naphthalene skeleton.

[Chemical Formula 4]

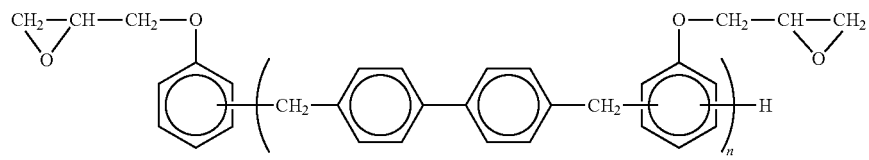

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 185 μΩ·cm, and the volume resistivity after heating was 866 μΩ·cm, so that the rate of variability in volume resistivity was 468%.

Comparative Example 5

An electrically conductive paste (containing 87.8% by weight of the total of the silver-coated copper powder and silver powder) was prepared by the same method as that in Example 1, except that an epoxy resin having a cyclopentadiene skeleton shown by Chemical Formula 5 (DX-1000 produced by Nippon Kayaku Co., Ltd.) was used in place of the epoxy resin having the naphthalene skeleton.

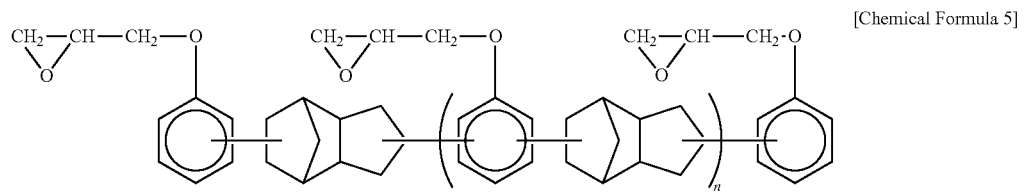

[Chemical Formula 5]

The electrically conductive paste thus obtained was used for forming an electrically conductive film by the same method as that in Example 1. Then, the initial volume resistivity and volume resistivity after heating thereof were calculated by the same methods as those in Example 1, and the rate of variability in volume resistivity due to heating was obtained by the same method as that in Example 1. As a result, the initial volume resistivity was 183 μcm, and the volume resistivity after heating was 275 μcm, so that the rate of variability in volume resistivity was 150%.

The results of these examples and comparative examples are shown in Tables 1-2.

TABLE 1

| | Electrically Conductive Paste | | | | | |
|---|---|---|---|---|---|---|
| | Silver-coated Copper Powder (wt. %) | Silver Powder (wt. %) | Dicarboxylic Acid | | | Epoxy Resin (wt. %) |
| | | | kind | In Paste (wt. %) | With respect to Ag (wt. %) | Mixing Method | |
| Ex. 1 | 79.0 | 8.8 | — | — | — | — | naphthalene skeleton |
| Ex. 2 | 79.0 | 8.8 | adipic acid | 0.006 | 0.07 | adhesion | naphthalene skeleton |
| Ex. 3 | 79.0 | 8.8 | adipic acid | 0.006 | 0.07 | addition | naphthalene skeleton |
| Ex. 4 | 79.0 | 8.8 | azelaic acid | 0.006 | 0.07 | | naphthalene skeleton |
| Ex. 5 | 79.0 | 8.8 | phthalic acid | 0.006 | 0.07 | adhesion | naphthalene skeleton |
| Ex. 6 | 79.0 | 8.8 | phthalic anhydride | 0.006 | 0.07 | adhesion | naphthalene skeleton |
| Ex. 7 | 43.9 | 43.9 | — | — | — | — | naphthalene skeleton |
| Ex. 8 | 43.9 | 43.9 | adipic acid | 0.018 | 0.04 | adhesion | naphthalene skeleton |
| Ex. 9 | 43.9 | 43.9 | adipic acid | 0.031 | 0.07 | adhesion | naphthalene skeleton |
| Ex. 10 | 43.9 | 43.9 | adipic acid | 0.043 | 0.10 | adhesion | naphthalene skeleton |
| Ex. 11 | 43.9 | 43.9 | adipic acid | 0.055 | 0.13 | adhesion | naphthalene skeleton |
| Comp. 1 | 79.9 | 8.9 | — | — | — | — | bisphenol F |
| Comp. 2 | 79.9 | 8.9 | adipic acid | 0.006 | 0.07 | adhesion | bisphenol F |
| Comp. 3 | 79.0 | 8.8 | — | — | — | — | bisphenol A |
| Comp. 4 | 79.0 | 8.8 | — | — | — | — | biphenyl skeleton |
| Comp. 5 | 79.0 | 8.8 | — | — | — | — | cyclopentadiene skeleton |

TABLE 2

| | Volume Resistivity of Electrically Conductive Film (μ Ω · cm) | | Rate of Variability in Volume Resistivity (%) |
|---|---|---|---|
| | Initial | After Heating | |
| Ex. 1 | 85 | 91 | 107 |
| Ex. 2 | 79 | 86 | 108 |
| Ex. 3 | 81 | 87 | 108 |
| Ex. 4 | 71 | 79 | 110 |
| Ex. 5 | 95 | 98 | 103 |
| Ex. 6 | 87 | 92 | 106 |
| Ex. 7 | 56 | 55 | 99 |
| Ex. 8 | 36 | 36 | 100 |
| Ex. 9 | 37 | 38 | 103 |
| Ex. 10 | 41 | 42 | 103 |
| Ex. 11 | 43 | 45 | 105 |
| Comp. 1 | 68 | 142 | 210 |
| Comp. 2 | 49 | 103 | 211 |
| Comp. 3 | 235 | 510 | 217 |
| Comp. 4 | 185 | 866 | 468 |
| Comp. 5 | 183 | 275 | 150 |

As can be seen from Tables 1-2, if any one of the electrically conductive pastes in Examples 1-11 is used for forming an electrically conductive film, it is possible to prevent the rise of the volume resistivity of the electrically conductive film even if the electrically conductive film is heated at a soldering temperature, in comparison with such cases that the electrically conductive pastes in Comparative Examples 1-5 are used.

As Examples 2-4, if the electrically conductive paste containing a dicarboxylic acid having a rational formula of HOOC—$(CH_2)_n$—COOH (n=1-8), such as adipic acid or azelaic acid, is used for forming an electrically conductive film, it is possible to lower the volume resistivity after heating of the electrically conductive film, in comparison with such cases that the electrically conductive paste containing no dicarboxylic acid is used as Example 1 and that the electrically conductive paste containing the dicarboxylic acid having the other rational formula than HOOC—$(CH_2)_n$—COOH (n=1-8), such as phthalic acid or phthalic anhydride, is used as Examples 5-6.

INDUSTRIAL APPLICABILITY

The electrically conductive paste according to the present invention can be utilized for producing electrically conductive patterns of circuit boards, and electronic parts, such as electrodes and circuits of substrates of solar cells and so forth. For example, it can be utilized for producing busbar electrodes of solar cells, and it can be utilized as an adhesive (bonding electrode) for bonding two solar cells, which are used as shingled-cells or the like, to each other.

The invention claimed is:

1. An electrically conductive paste comprising:
    a silver-coated copper powder having a copper powder, the surface of which is coated with a silver layer, the amount of the silver-coated powder being 40 to 94% by weight with respect to the electrically conductive paste;
    a silver powder, the amount of which is 4 to 58% by weight with respect to the electrically conductive paste;
    an epoxy resin having a naphthalene skeleton, the amount of epoxy resin being 1 to 20% by weight with respect to the electrically conductive paste;
    a solvent, the amount of which is 0 to 20% by weight with respect to the electrically conductive paste;
    a curing agent, the amount of which is 0.1 to 10% by weight of the epoxy resin;
    a dispersant; and
    a dicarboxylic acid, the amount of which is 0.01 or more and less than 0.25% by weight with respect to silver in the silver layer and the silver powder,
    wherein the total amount of the silver-coated copper powder and the silver powder therein is 75 to 98% by weight, and
    wherein the total amount of the silver-coated copper powder, the silver powder, the epoxy resin, the solvent, the curing agent, the dispersant and the dicarboxylic acid in the electrically conductive paste is 100% by weight.

2. An electrically conductive paste as set forth in claim 1, wherein said dicarboxylic acid is adhered to said silver powder.

3. An electrically conductive paste as set forth in claim 1, wherein said dicarboxylic acid is a dicarboxylic acid having a rational formula of HOOC—$(CH_2)_n$—COOH (n=1-8).

4. An electrically conductive paste as set forth in claim 3, wherein said n in said rational formula is 4 to 7.

5. An electrically conductive paste as set forth in claim 1, wherein the amount of said dicarboxylic acid is not more than 0.1% by weight with respect to said electrically conductive paste.

6. An electrically conductive paste as set forth in claim 1, wherein said silver-coated copper powder has an average particle diameter of 1 to 20 μm, and said silver powder has an average particle diameter of 0.1 to 3 μm.

7. An electrically conductive paste as set forth in claim 1, wherein the amount of said silver layer with respect to said silver-coated copper powder is not less than 5% by weight.

8. An electrically conductive paste as set forth in claim 1, wherein said solvent is one or more selected from the group consisting of butyl carbitol acetate (BCA), butyl carbitol (BC), ethyl carbitol acetate (ECA), ethyl carbitol (EC), toluene, methyl ethyl ketone, methyl isobutyl ketone, tetradecane, tetralin, propyl alcohol, isopropyl alcohol, dihydroterpineol, dihydroterpineol acetate, ethyl carbitol, and 2,2,4-trimethyl-1,3-pentanediol monoisobutyrate (texanol).

9. An electrically conductive paste as set forth in claim 1, wherein said curing agent is at least one of imidazole and boron trifluoride amine.

10. An electrically conductive paste as set forth in claim 1, wherein the amount of said epoxy resin having the naphthalene skeleton is 3 to 10% by weight with respect to the electrically conductive paste.

11. An electrically conductive paste as set forth in claim 1, wherein the amount of said solvent is 0 to 10% by weight with respect to the electrically conductive paste.

12. An electrically conductive paste as set forth in claim 1, wherein the amount of said curing agent is 0.2 to 6% by weight of the epoxy resin.

* * * * *